United States Patent
Weggel

(10) Patent No.: US 6,320,370 B1
(45) Date of Patent: Nov. 20, 2001

(54) CIRCUIT WITH IMPROVED DYNAMIC RESPONSE FOR MEASURING CURRENT IN PULSE WIDTH MODULATED AMPLIFIERS

(75) Inventor: Craig R. Weggel, Willow Grove, PA (US)

(73) Assignee: MTS Systems Corporation, Eden Prairie, MN (US)

( * ) Notice: Subject to any disclaimer, the term of this patent is extended or adjusted under 35 U.S.C. 154(b) by 0 days.

(21) Appl. No.: 09/443,825

(22) Filed: Nov. 19, 1999

Related U.S. Application Data
(60) Provisional application No. 60/110,295, filed on Nov. 30, 1998.

(51) Int. Cl.[7] .................................................. G01R 31/28
(52) U.S. Cl. ...................................... 324/117 R; 324/127
(58) Field of Search ............................... 324/127, 117 R, 324/126, 140, 142, 537; 363/56

(56) References Cited

U.S. PATENT DOCUMENTS

| | | | |
|---|---|---|---|
| 4,365,422 | 12/1982 | Kawaguchi | 34/1 |
| 4,404,623 | 9/1983 | Jourdan | 363/56 |
| 4,542,440 | 9/1985 | Cheety et al. | 361/111 |
| 4,584,635 | 4/1986 | MacInnis et al. | 363/25 |
| 4,912,396 * | 3/1990 | Groenenboom | 324/117 R |
| 5,070,292 | 12/1991 | Goff | 318/811 |
| 5,081,409 | 1/1992 | Goff | 318/811 |
| 5,379,209 | 1/1995 | Goff | 363/132 |
| 5,629,616 * | 5/1997 | Weggel | 324/117 R |

FOREIGN PATENT DOCUMENTS

| | | |
|---|---|---|
| 332737 | 2/1921 | (DE) . |
| 2202338A | 9/1988 | (GB) . |

* cited by examiner

*Primary Examiner*—Vinh P. Nguyen
(74) *Attorney, Agent, or Firm*—Westman, Champlin & Kelly, P.A.

(57) ABSTRACT

A circuit for measuring current flowing through a load driven by a pulse width modulation (PWM) circuit in response to PWM control signals, according to the present invention, includes a transformer having primary and secondary windings, with the primary winding connected to the load. Current cancellation circuitry coupled to the secondary winding is adapted to apply a cancellation current to the secondary winding and to provide an output which is indicative of a level of current through the load. An inverter coupled to the current cancellation circuitry output provides an inverted current cancellation circuitry output. First and second switches selectively couple one of the current cancellation circuitry output and the inverted current cancellation circuitry output to a load current output which provides an output indicative of the level of current through the load during both static and dynamic load current conditions.

18 Claims, 1 Drawing Sheet

CIRCUIT WITH IMPROVED DYNAMIC RESPONSE FOR MEASURING CURRENT IN PULSE WIDTH MODULATED AMPLIFIERS

The present application claims the benefit of earlier filed U.S. Provisional Application No. 60/110,295, filed on Nov. 30, 1998 entitled "CIRCUIT FOR MEASURING CURRENT IN CLASS-D AMPLIFIERS WITH IMPROVED DYNAMIC RESPONSE".

BACKGROUND OF THE INVENTION

The present invention relates to the field of current measurement, particularly in the context of pulse-width-modulated (PWM) circuits. More specifically, the invention relates to a circuit which provides accurate measurement of current flowing through a load, while maintaining galvanic isolation between the measurement circuit and the load, under both static and dynamic conditions.

Examples of PWM circuits are shown in U.S. Pat. Nos. 5,070,292, 5,081,409, 5,379,209, and 5,365,422. The disclosures of these patents are hereby incorporated by reference. These patents provide examples of circuits in which a series of pulses is used to control electronic switches which selectively connect a power supply to a load. The load can be an electric motor, or a coil used to produce a magnetic field, or some other load.

In PWM circuits of the types described in the above-cited patents, it is often necessary to monitor the current flowing through the load, either for purposes of overcurrent protection, or to control another circuit based on the measured current in the load, or for other reasons. Direct measurement of load current is undesirable because it requires the insertion of an inductance or a resistance into the circuit being monitored. Preferably, the current measurement technique will maintain galvanic isolation, i.e. insuring that no current flows directly between the load and the measuring circuit.

However, in the prior art, there are few techniques for measuring load current in a PWM circuit while maintaining galvanic isolation. While the load can be coupled, through a transformer, to a conventional circuit for current measurement, the accumulation of magnetic flux in the transformer core accentuates the nonlinearity of the transformer and introduces inaccuracy into the final measurement. A solution to this problem is to use a larger transformer, which is less likely to experience core saturation and which therefore provides a greater range over which the transformer response is relatively linear. However, using a larger transformer has the disadvantage of requiring a larger space, and it may also be unacceptably expensive.

In some current measurement circuits, during times in which the sensed load current is changing in response to PWM control signals, the output of the current measurement circuit may not represent the actual load current with the level of accuracy desired. For example, in some current measurement circuits, the load current indicative output can be erroneous by an amount proportional to the rate of change of the load current. The present invention provides accurate measurement of the load current in a PWM circuit under both static and dynamic conditions.

SUMMARY OF THE INVENTION

A circuit for measuring current flowing through a load driven by a pulse width modulation (PWM) circuit in response to PWM control signals, according to the present invention, includes a transformer having primary and secondary windings, with the primary winding connected to the load. Current cancellation circuitry coupled to the secondary winding is adapted to apply a cancellation current to the secondary winding and to provide an output which is indicative of a level of current through the load. An inverter coupled to the current cancellation circuitry output provides an inverted current cancellation circuitry output. First and second switches selectively couple one of the current cancellation circuitry output and the inverted current cancellation circuitry output to a load current output which provides an output indicative of the level of current through the load during both static and dynamic current conditions.

DETAILED DESCRIPTION OF THE PREFERRED EMBODIMENTS

Figure 1:
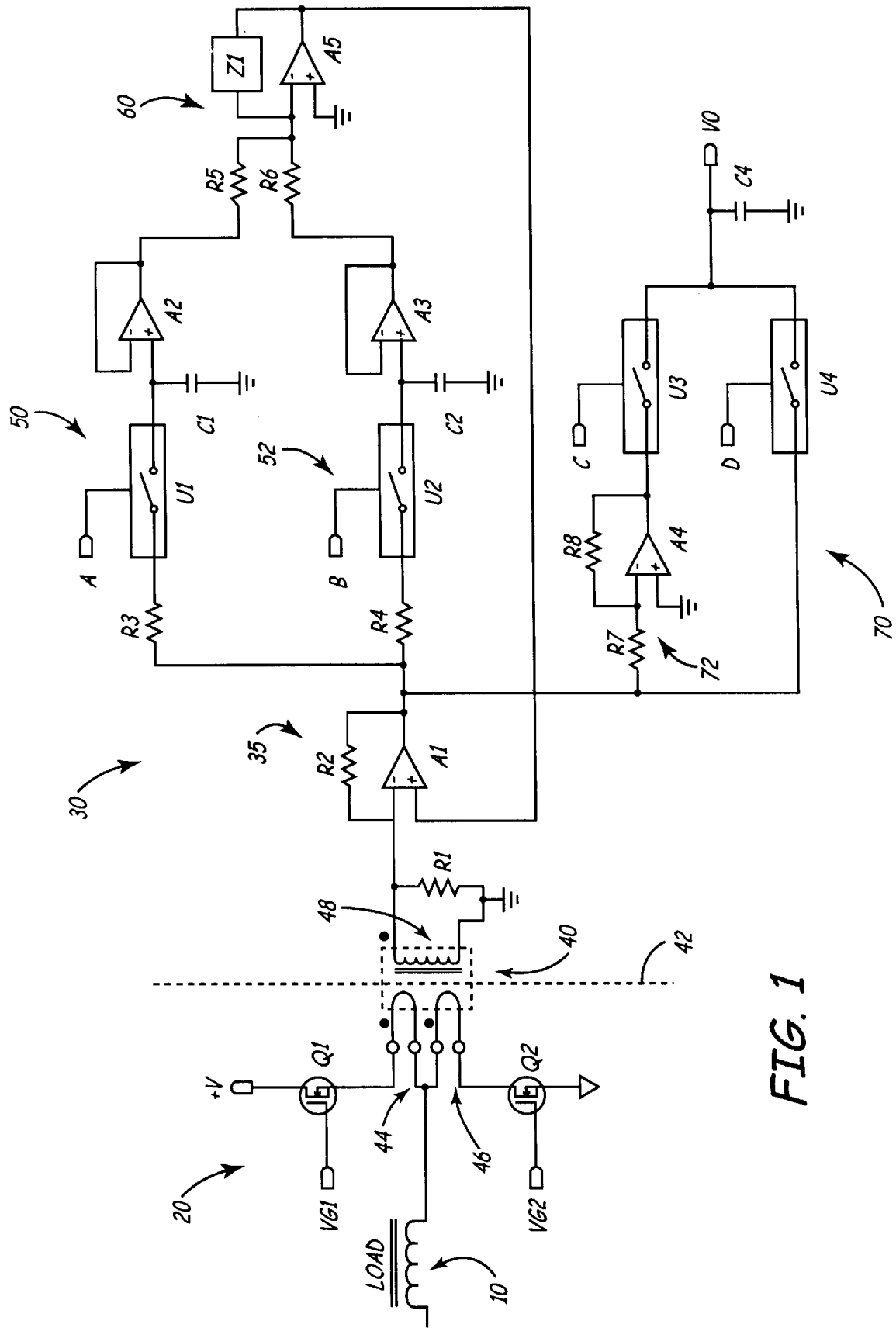
FIG. 1 is a schematic diagram of a current measurement circuit according to the present invention.

The present invention includes a circuit which provides continuous monitoring of a sensed load current in a PWM circuit, under both static and dynamic conditions. By providing a means to continuously monitor the sensed load current under both static and dynamic conditions, a more accurate representation of the actual load current can be obtained. The left-hand portion of FIG. 1 shows part of a pulse-width modulation (PWM) circuit 20 which applies current to a load 10 through an H-bridge totem. The H-bridge totem includes switches Q1 and Q2, and may include additional totems as is known in the art and as is described in the patents cited above. The power supply voltage, represented in the FIGURE as +V, is applied between the drain of Q1 and the source of Q2, as indicated. Note that the "ground" for the power supply is, in general, different from the "ground" for the measurement circuit 30 on the right-hand side of the FIG. 1. These two "grounds" are therefore represented by different symbols.

Switch Q1 is controlled by voltage VG1, applied to the gate of switch Q1. Similarly, switch Q2 is controlled by voltage VG2, applied to the gate of switch Q2. Both VG1 and VG2 are preferably PWM control signals which are derived in a conventional manner.

Transformer 40 is connected between the PWM circuit 20 and the measurement circuit 30. Dotted line 42, which passes through the transformer, represents the isolation boundary between these two circuits. As indicated in FIG. 1, the primary windings of the transformer are connected to the PWM circuit, and to the load. There are two primary windings, namely winding 44 connected between switch Q1 and the load, and winding 46 connected between switch Q2 and the load. The dots near primary windings 44 and 46 indicate that current in the secondary winding will be bipolar, i.e. positive for the first half of the PWM cycle and negative for the second half.

The current measurement circuit 30 includes a first flux cancellation circuit 35 which includes resistor R1, amplifier A1, and resistor R2. Resistor RI has a relatively small value, and provides a current path for high-frequency components, higher than the bandwidth of amplifier A1, and maintains a low impedance across the secondary winding 48 of transformer 40. Amplifier A1 generates a voltage across R2 which tends to maintain a zero voltage across R1. The output of amplifier A1 is representative of the current in the secondary winding of the transformer. More specifically, the magnitude of the voltage at the output of A1 is representative of the magnitude of the current flowing through load 10. The phase of the voltage is representative of the polarity of the current flowing through the load. As used herein, the term "phase" means the phase of a rectangular pulse. If current flows in one direction through the load, the pulses are positive-going and then negative going, while if current flows in the opposite direction, the pulses are negative-going and then positive-going.

Since the amplifier A1 applies a voltage across the secondary 48 which tends to cancel the current in the secondary, the magnetic flux in the transformer core tends to be near zero. However, since there is always a finite amount of error in the signal generated by amplifier A1, used to produce an opposing current in secondary winding 48, the magnetic flux in the transformer core is not completely cancelled. Moreover, in the case where the first half of the PWM cycle has a duration different from that of the second half of the PWM cycle, a DC component in the signal flowing through the primary winding of the transformer will be present. The lack of complete flux cancellation will result in "flux creepage" in the transformer core. Since flux is the integral, over time, of the sum of the induced voltages across all phases of the transformer, as shown by Faraday's law, or, in other words, the average value of volt-seconds across all phases of the transformer is nonzero, the flux will increase or decrease, depending on the polarity of the net voltage, and will continue to increase or decrease for as long as there is an imbalance in volt-seconds. The latter problem is solved by a further mechanism for canceling flux, described below.

The second flux cancellation mechanism includes two identical peak detection circuits 50 and 52 for monitoring the peak excursions of the voltage signal at the output of amplifier A1. In an exemplary embodiment, circuit 50 includes switch U1, resistor R3, capacitor C1, and amplifier A2. In this exemplary embodiment, the second circuit 52 includes switch U2, resistor R4, capacitor C2, and amplifier A3. Element U1 is an electronic switch which is controlled by signal A. Element U2 is an electronic switch controlled by signal B. Signals A and B are derived from the PWM signals VG1 and VG2 used to drive the PWM circuit 20.

In a first embodiment, signal A can be the same as VG1 and signal B could be the same as VG2, i.e. the signals which drive the switches in PWM circuit 20 which applies current to the load. However, it is preferable in some embodiments to introduce a small time delay relative to signals VG1 and VG2, of the order of one microsecond, to the switch control signals A and B. Thus, signal A can be signal VG1 delayed by about one microsecond, and signal B can be signal VG2 delayed by the same amount. The reason for the time delay is that switches Q1 and Q2 require a finite time to open or close, following a change of state of the control signals VG1 and VG2. The peak detection circuits 50 and 52 will perform more accurately if switches U1 and U2 close after the corresponding main switch (Q1 or Q2) has fully closed. Also, in some embodiments signals A and B have pulse widths which are narrower than signals VG1 and VG2, and which are approximately centered within these pulses to capture the peaks more accurately.

The time delay can be implemented by conventional means, such as by using an R-C circuit. It can also be implemented with discrete logic, or with a microprocessor (or its equivalent) which counts through a predetermined time interval and closes an appropriate switch upon reaching a predetermined count. In yet other embodiments, signals A and B are derived from signals VG1 and VG2 such that peak detector circuits 50 and 52 capture the peak at approximately the center of the rectangular pulses of the current through the load. Those skilled in the art will recognize that other timing schemes can be used to generate signals A and B used to drive peak detectors 50 and 52.

The peak detection circuit 50 operates as follows. When the switch U1 is closed, capacitor C1 is charged to the level of the voltage appearing at the output of amplifier A1. The value of capacitor C1 is sufficiently high that it can hold a charge for a period which is much longer than the average period of the PWM pulses. Thus, capacitor C1 "remembers" the last voltage applied to it. Amplifier A2 acts as a buffer, making it possible to drive the next stage (to be explained below) without discharging capacitor C1. The peak detection circuit 52 operates in a similar manner.

Due to the manner of derivation of signals A and B, the two peak detection circuits measure the peak excursions of voltage, at the output of amplifier A1, in the positive and negative directions. The peak detection circuits detect the peaks correctly due to the fact that they are controlled by derivations of the signals VG1 and VG2 which control the basic PWM circuit 20.

Flux balance error circuit 60 includes amplifier A5, resistors R5 and R6, and impedance Z1. If impedance Z1 is a capacitor, this circuit integrates the sum of the signals generated by amplifiers A2 and A3 of peak detectors 50 and 52. If impedance Z1 is a resistor, this circuit amplifies the sum of the signals generated by amplifiers A2 and A3. Since the outputs of amplifiers A2 and A3 are normally of opposite polarity, and if the duty cycle is such that switches Q1 and Q2 are open and closed for the same amounts of time, there will be no net flux developed in the transformer core. In this case, the outputs of amplifiers A2 and A3 will be equal and opposite, and the output of amplifier A5 will be zero. To the extent that the duty cycle varies from the above-described condition, the output of amplifier A5 will be nonzero, and will represent any flux imbalance resulting from the DC component in the transformer. This output is fed back to amplifier A1 for canceling the DC component to maintain the average flux density in the core at zero. In effect, amplifier A5 senses the imbalance in volt-seconds between primary winding 44 (adjacent to Q1) and primary winding 46 (adjacent to Q2), and provides feedback which tends to cancel this imbalance.

There are several advantages in maintaining the flux in the transformer core at zero. The transformer exhibits a nonlinear relationship between current in the primary and current induced in the secondary, and this nonlinearity becomes especially pronounced at high levels of flux, when the transformer core approaches saturation. Moreover, these non-linearities are temperature-dependent. Maintaining the flux level near zero avoids or minimizes such problems. Maintaining the flux at or near zero also has the advantage that it is feasible to use a relatively small transformer to achieve relatively high linearity, thus reducing the cost of the circuit, the weight of the circuit, and the space occupied by the circuit.

To monitor the current in load 10, measurement circuit 30 also includes circuit 70 adapted to provide output signal VO which is proportional to the current flowing through load 10. Circuit 70 includes resistors R7 and R8, amplifier A4, and switches U3 and U4. Amplifier A4 and resistors R7 and R8 are configured to form an inverter circuit 72. In some embodiments, resistors R7 and R8 have identical values such that inverter circuit 72 provides an inverted unity gain of the output of amplifier A1. Thus, circuit 72 provides an inverted sensed current signal to switch U3, while switch U4 is connected directly to the non-inverted sensed current signal provided as a voltage output of amplifier A1. Under the control of signals C and D, switches U3 and U4 alternately connect the sensed current voltage signal and the inverted sensed current voltage signal to reservoir capacitor C4. In some embodiments, reservoir capacitor C4 is a high frequency filter capacitor. Control signals C and D are, in one embodiment, equivalent to control signals VG1 and VG2, respectively, with slight delays added. In one embodiment, while control signals A and B of peak detectors 50 and 52 have pulse widths which are considerably shorter than the pulse widths of VG1 and VG2, control signals C and D have pulse widths which are approximately equal to the pulse widths of VG1 and VG2. This results in sensed load current signal VO yielding an accurate representation of the actual load current during both static and dynamic load current conditions.

While the invention has been described with respect to particular embodiments, the invention can be modified in other ways, within the scope of the disclosure. The specific form of the amplifiers and switches can be varied. The invention can be used to measure load current in various kinds of circuits, and is not necessarily limited to use with an H-bridge totem. Such modifications, and others which will be apparent to those skilled in the art, should be considered within the spirit and scope of the following claims.

What is claimed is:

1. A circuit for measuring current flowing through a load driven by a pulse width modulation (PWM) circuit in response to PWM control signals, the circuit for measuring comprising:
    a transformer having primary and secondary windings, the primary winding being connected to the load;
    flux cancellation circuitry coupled to the secondary winding and adapted to apply a cancellation current to the secondary winding, the flux cancellation circuitry providing an output which is indicative of a level of current through the load;
    a load current output indicative of the level of current through the load;
    an inverter coupled to the flux cancellation circuitry output and providing an inverted flux cancellation circuitry output;
    a first switch selectively coupling the flux cancellation circuitry output to the load current output in response to a first signal generated as a function of the PWM control signals; and
    a second switch selectively coupling the inverted flux cancellation circuitry output to the load current output in response to a second signal generated as a function of the PWM control signals.

2. The circuit for measuring of claim 1, wherein the first and second signals are generated by delaying the PWM control signals.

3. The circuit for measuring of claim 2, wherein the first and second signals have pulse widths which are approximately equal.

4. The circuit for measuring of claim 3, wherein the pulse widths of the first and second signals are also approximately equal to the pulse widths of the PWM control signals.

5. The circuit for measuring of claim 1, wherein the first and second signals control the first and second switches to alternately connect to the load current output one of the flux cancellation circuitry output and the inverted flux cancellation circuitry output.

6. The circuit for measuring of claim 1, wherein the flux cancellation circuitry comprises:
    a first resistor coupled in parallel across the secondary windings;
    a first amplifier having a non-inverting input coupled to the secondary windings and to the first resistor; and
    a second resistor coupled between the non-inverting input and an output of the first amplifier, the flux cancellation circuitry output being provided at the output of the first amplifier.

7. The circuit for measuring of claim 6, and further comprising:
    peak detection circuitry, coupled to the flux cancellation circuitry output and adapted to determine a maximum positive voltage and a maximum negative voltage of the flux cancellation circuitry output; and
    flux balance circuitry, coupled to the peak detection circuitry and providing a feedback signal to the flux cancellation circuitry as a function of the maximum positive voltage and the maximum negative voltage, wherein the flux cancellation circuitry is further adapted to provide the cancellation current as a function of the feedback signal.

8. The circuit for measuring of claim 7, wherein the peak detection circuitry comprises:
    a second amplifier configured to provide as an output the maximum positive voltage of the flux cancellation circuitry output;
    a third switch selectively coupling the flux cancellation circuitry output to an input of the second amplifier;
    a third amplifier configured to provide as an output the maximum negative voltage of the flux cancellation circuitry output; and
    a fourth switch selectively coupling the flux cancellation circuitry output to an input of the third amplifier.

9. The circuit for measuring of claim 8, wherein the third and fourth switches are controlled by third and fourth signals generated as a function of the PWM control signals.

10. The circuit for measuring of claim 9, wherein the third and fourth signals have pulse widths which are approximately equal.

11. The circuit for measuring of claim 10, wherein the pulse widths of the third and fourth signals are substantially shorter than the pulse widths of the PWM control signals.

12. The circuit for measuring of claim 7, wherein the flux balance circuitry includes an integrator circuit configured to integrate a summation of the maximum positive voltage and the maximum negative voltage, and to provide the feedback signal as a function of the integration of the summation.

13. A method of measuring current flowing through a load driven by a pulse width modulation (PWM) circuit in response to PWM control signals, the method comprising:
    generating a cancellation current using flux cancellation circuitry and applying the cancellation current to a secondary winding of a transformer, a primary winding of the transformer being coupled to the load;
    generating a flux cancellation circuitry output which is indicative of a level of current through the load;
    inverting the flux cancellation circuitry output using an inverter to provide an inverted flux cancellation circuitry output; and
    selectively and alternately coupling the flux cancellation circuitry output and the inverted flux cancellation circuitry output to a load current output to provide a load current output signal indicative of the level of current through the load.

14. The method of claim 13, wherein selectively and alternately coupling the flux cancellation circuitry output and the inverted flux cancellation circuitry output to the load current output further comprises controlling first and second switches, respectively coupling the flux cancellation circuitry output and the inverted flux cancellation circuitry output to the load current output, in response to first and second signals generated as a function of the PWM control signals.

15. The method of claim 14, wherein the first and second signals are generated by delaying the PWM control signals.

16. The method of claim 15, wherein the first and second signals have pulse widths which are approximately equal.

17. The method of claim 16, wherein the pulse widths of the first and second signals are also approximately equal to the pulse widths of the PWM control signals.

18. A circuit for measuring current flowing through a load driven by a pulse width modulation (PWM) circuit in response to PWM control signals, the circuit for measuring comprising:

transformer means, having primary and secondary windings, for providing galvanic isolation from the load, the primary winding being connected to the load;

current cancellation means for applying a cancellation current to the secondary winding, the current cancellation means providing an output which is indicative of a level of current through the load;

load current output means for providing an output signal indicative of the level of current through the load;

inverter means for providing an inverted current cancellation means output; and switch means for selectively and alternately coupling the current cancellation means output and the inverted current cancellation means output to the load current output means in response to first and second signals generated as a function of the PWM control signals.

* * * * *